United States Patent [19]
Yoshiharu et al.

[11] Patent Number: 4,925,809
[45] Date of Patent: May 15, 1990

[54] SEMICONDUCTOR WAFER AND EPITAXIAL GROWTH ON THE SEMICONDUCTOR WAFER WITH AUTODOPING CONTROL AND MANUFACTURING METHOD THEREFOR

[75] Inventors: Tetsujiro Yoshiharu, Amagasaki; Haruo Kamise, Saga, both of Japan

[73] Assignees: Osaka Titanium Co., Ltd., Amagasaki; Kyushu Electronic Metal Co., Ltd., Kishima, both of Japan

[21] Appl. No.: 214,501

[22] Filed: Jul. 1, 1988

Related U.S. Application Data

[62] Division of Ser. No. 50,389, May 18, 1987.

[51] Int. Cl.$^5$ ............................................. H01L 21/20
[52] U.S. Cl. ................................... 437/95; 437/228; 437/946; 148/33.3; 148/DIG. 161
[58] Field of Search .................. 437/238, 235, 12

[56] References Cited

U.S. PATENT DOCUMENTS

| | | |
|---|---|---|
| 3,313,661 | 4/1967 | Blake . |
| 3,503,798 | 3/1970 | Yoshioka et al. . |
| 3,769,104 | 10/1973 | Ono .................................... 437/238 |
| 3,795,554 | 3/1974 | Tarn . |
| 3,896,254 | 7/1975 | Berkner . |
| 3,934,060 | 1/1976 | Burt et al. . |
| 4,279,947 | 7/1981 | Goldman et al. . |
| 4,344,260 | 8/1982 | Ogiwara ............................ 51/283 E |
| 4,395,438 | 7/1983 | Chiang . |
| 4,428,975 | 1/1984 | Dahm et al. . |
| 4,431,710 | 2/1984 | Lifshin et al. . |
| 4,630,093 | 12/1986 | Yamaguchi et al. . |
| 4,687,682 | 8/1989 | Koze ................................... 437/238 |

FOREIGN PATENT DOCUMENTS

| | | |
|---|---|---|
| 57-197834 | 12/1982 | Japan . |
| 214526 | 9/1986 | Japan . |
| 240638 | 10/1986 | Japan . |

OTHER PUBLICATIONS

"Semiconductor Silicon Manufacturing and Machining Using Diamond Tools", G, Janus, Burghausen.

Primary Examiner—Brian E. Hearn
Assistant Examiner—Laura Holtzman
Attorney, Agent, or Firm—Burns, Doane, Swecker & Mathis

[57] ABSTRACT

A semiconductor wafer on which silicon or the like is epitaxially grown and p-type or n-type impurities are doped and which has at the rear surface except for the peripheral edge portion thereof a blocking film for preventing jumping out of impurities therefrom which causes auto-doping, thereby preventing silicon particles from being produced at the peripheral surface and preventing the semiconductor wafer from being contaminated by the silicon particles during the manufacturing of a semiconductor device.

6 Claims, 7 Drawing Sheets

SEMICONDUCTOR WAFER AND EPITAXIAL GROWTH ON THE SEMICONDUCTOR WAFER WITH AUTODOPING CONTROL AND MANUFACTURING METHOD THEREFOR

This application is a continuation, of application Ser. No. 050,389, filed May 18, 1987.

BACKGROUND OF THE INVENTION

1. Field of the Invention

The present invention relates to a semiconductor wafer used as a substrate for various kinds of semiconductor device and to a manufacturing method for the semiconductor wafer.

2. Description of the Prior Art

Usually, an epitaxial wafer is often doped with impurity in high concentration to provide a p-type or an n-type conductive element.

For example, when a conductive element is of p-type, boron(B) is doped as the impurity into a silicon wafer in high concentration, and when it is of n-type, phosphorus (P), antimony(Sb), arsenic (As), etc. are doped as the same.

When such doped wafer is heated at high temperature of 1000° to 1200° C. to grow silicon epitaxially thereon, it is well-known that boron, phosphorus, antimony, arsenic or the like jump out from the substrate wafer to enter the epitaxial growth layer to thereby produce the so-called auto-doping phenomenon, resulting in that the electrical characteristic is changed.

Jumping out of boron, phosphorus, antimony or arsenic from the wafer is suppressed at the main surface thereof because of forming the epitaxial growth layer, whereby such element jumps out mainly from the peripheral surface and the rear surface (opposite to the main surface). Hence, in order to prevent jumping out of much element from occurring at this part, a method has hitherto been adopted which forms a film of $SiO_2$ and/or $Si_3N_4$ or the like as a blocking film thereat.

FIG. 1 is an illustration of the process of forming the epitaxial layer at the conventional wafer. As shown in FIG. 1-(a), for preventing a peripheral edge portion of a disclike semiconductor substrate wafer from being chipped off when it is handled, it is chamfered at both surfaces to form tapered faces 1a and 1b and a portion 1c arcuated in section therebetween and after a damaged layer is removed by chemical etching, the blocking film is formed over the entire surface of the substrate wafer 1 by an atmospheric pressure CVD method or a thermal oxidation method. FIG. 1-(b) shows the wafer on which one or two layers of blocking film of $SiO_2$ and/or $Si_3N_4$ are laminated by the atmospheric pressure CVD method. FIG. 1-(b') shows the wafer on which the aforesaid layers are laminated by the thermal oxidation method. The blocking film, when formed by the atmospheric pressure CVD method, is smaller in thickness at the main surface (the upper surface in the drawing) of the substrate wafer 1 as shown in FIG. 1(b), and when formed by the thermal oxidation method, is substantially uniform in thickness through the entire surface as shown in FIG. 1(b').

Upon completing forming the blocking film 2, the substrate wafer 1 is subjected at the main surface side thereof to polish, the blocking film 2 formed on the main surface is removed by lapping, and the main surface is finished to be a mirror. Thus, as shown in FIG. 1-(c), a wafer 10, which is covered with the blocking film 2 on the entire rear surface and the peripheral surface except for about half a portion of the tapered face 1a at the main surface side, is obtained. Such wafer 10 is provided at the main surface thereof with an epitaxial layer 3 as shown in FIG. 1-(d).

When the epitaxial growth of silicon is applied onto the main surface of the wafer 10 having the blocking film 2 formed thereon as abovementioned, since the blocking film 2 is formed on the peripheral surface and the rear surface of the same, the auto-doping from the substrate wafer 1 toward the epitaxial layer 3 is remarkably suppressed during the process of forming the epitaxial layer 3 on the main surface of the substrate wafer 1, thereby expecting an improvement in quality of the epitaxial layer 3 itself.

FIG. 2 is a graph showing an extent of auto-doping when the blocking film is formed (shown by solid line) and that when it is not formed (shown by the broken line) as the results of testing the spreading resistance (SR). A depth from the epitaxial layer surface is taken in the axis of abscissa and the impurity concentration (logarithmic scale, optional unit) is taken in the axis of ordinate, whereby it is apparent that the impurity concentration at the epitaxial layer is largely reduced by forming the blocking film.

On the other hand, as seen from FIG. 1-(d), silicon included in reaction gas is formed in many granulated particles polysilicon 3a on the blocking film 2, especially on the peripheral surface of the substrate wafer 1, during the process of epitaxial growth on the main surface of the same. The silicon particles 3a drop from the surface of the blocking film and attach to the surface of the epitaxial layer 3 or the like during the process of producing a semiconductor device (product), thereby causing contamination thereon, and creating a problem in that the yield of product lowers.

FIG. 3 is a microphotograph showing an outside appearance taken on the line III—III in FIG. 1-(d) and FIG. 4 is one taken on the line IV—IV in FIG. 1-(d). As seen from them, many silicon particles are formed on the peripheral surface of the blocking film.

SUMMARY OF THE INVENTION

In order to solve the above problem, the present invention has been designed.

A first object of this invention is to provide a semiconductor wafer which reduces a blocking film formation region as much as possible so as to prevent jumping out of impurities which causes auto-doping and which is free from contamination on the epitaxial layer caused by silicon particles.

A second object of this invention is to provide a semiconductor wafer having an epitaxial layer formed without diffusion of the impurities caused by the auto-doping thereinto and without being contaminated by the silicon particles.

A third object of this invention is to provide a manufacturing method for a semiconductor wafer, which is free from the auto-doping and contamination caused by silicon particles and improvable in the yield of product.

The above and further objects and features of the invention will more fully be apparent from the following detailed description with accompanying drawings.

DESCRIPTION OF THE PREFERRED EMBODIMENTS

Next, an embodiment of a semiconductor wafer of the invention will be concretely described in accordance with the drawings.

Figure 5:
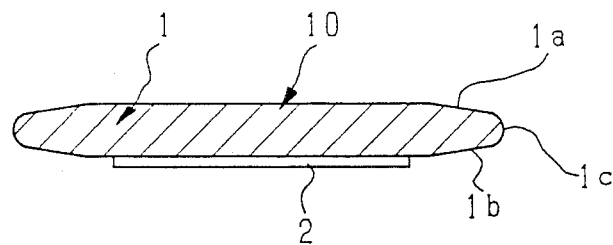
FIG. 5 is a schematic sectional view of a semiconductor wafer of the present invention, FIGS. 6(a)-(c') are a schematic sectional view showing a manufacturing process of the semiconductor wafer shown in FIG. 5.

FIG. 5 is a structural view in section of a semiconductor wafer 10 of the invention (to be hereinafter called the product of the invention), in which reference numeral 1 designates a semiconductor substrate wafer made of silicon. The semiconductor substrate wafer 1 is chamfered at the peripheral edge portion thereof from above and below to form the tapered faces 1a and 1b and a portion 1c, about arcuated in section and connecting the outer edges of both the tapered surfaces 1a and 1b. At the whole area of the rear surface (the surface opposite to the main surface on which the epitaxial layer is to be formed) except for the portion apart from the edge of the lower side tapered face 1b toward the center by several millimeters (about 3 mm), a blocking film 2 is formed. The blocking film 2 is made of $SiO_2$ (or $Si_3N_4$) and about 0.1 to 1 μm in thickness. The region where the blocking film 2 is formed is not necessarily defined to the above-mentioned range, but need only be a range allowable of the influence by the auto-doping on the peripheral surface of the substrate wafer 1 where the silicon particles are apt to be formed, that is, the rear surface of the substrate wafer 1 except for the tapered faces 1a and 1b and the portion 1c arcuated in section. In addition, when the region of the blocking film 2 is made too small, the auto-doping phenomenon is developed to vary the electrical characteristic, which is not preferable.

The material for the blocking film 2 is not limited to the $SiO_2$ film, but may alternatively be a $Si_3N_4$ film or be laminated of two films of $SiO_2$ and $Si_3N_4$.

Figure 6:
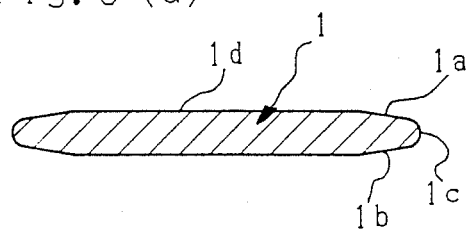
Figure 6:
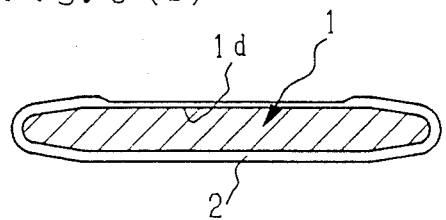
Figure 6:
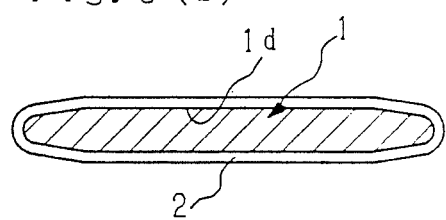
Figure 6:
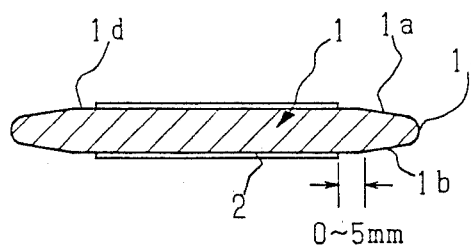
Figure 6:
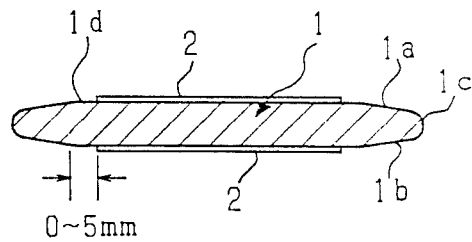

FIG. 6 is a typical view explanatory of the manufacturing process of the product of the invention. Referring to FIG. 6-(a), at first, the substrate wafer 1 is chamfered at the periphery thereof to form the tapered faces 1a and 1b and the peripheral portion 1c arcuated in section, onto which the blocking film 2 is formed. For example, when the atmospheric pressure CVD method is applied, the substrate wafer 1 is placed keeping the main surface 1d thereof below on a pad (not shown) at a reaction furnace and then heated to attach a $SiO_2$ (and/or $Si_3N_4$) film of required thickness (0.1 to 1.0 μm) onto the rear surface facing upwardly and the peripheral portion including the tapered faces 1a and 1b and the portion 1c arcuated in section. In the atmospheric CVD method, a minute gap is formed between the pad and the main surface 1d of the substrate wafer 1, whereby the blocking film 2 is formed in small thickness on the main surface 1d as well as the rear surface and the peripheral surface of the substrate wafer 1 as shown in FIG. 6-(b).

Alternatively, as shown in FIG. 6-(b'), the thermal oxidation method, in which the substrate wafer 1 is provided at the entire surface with the blocking film 2 substantially uniform in thickness, may be applied.

As shown in FIG. 6-(c) and FIG. 6-(c'), the substrate wafer 1, after completing forming the blocking film 2, removes the blocking film in a range of at least the peripheral surface including the tapered faces 1a and 1b and the portion 1c arcuated in section or the peripheral edge beyond the tapered face 1b at the rear surface of the substrate wafer 1, in other words, removes the blocking film in an annular portion of about 0 to 5 mm in width from the edge of the tapered face 1b toward the center of the substrate wafer 1.

Figure 7:
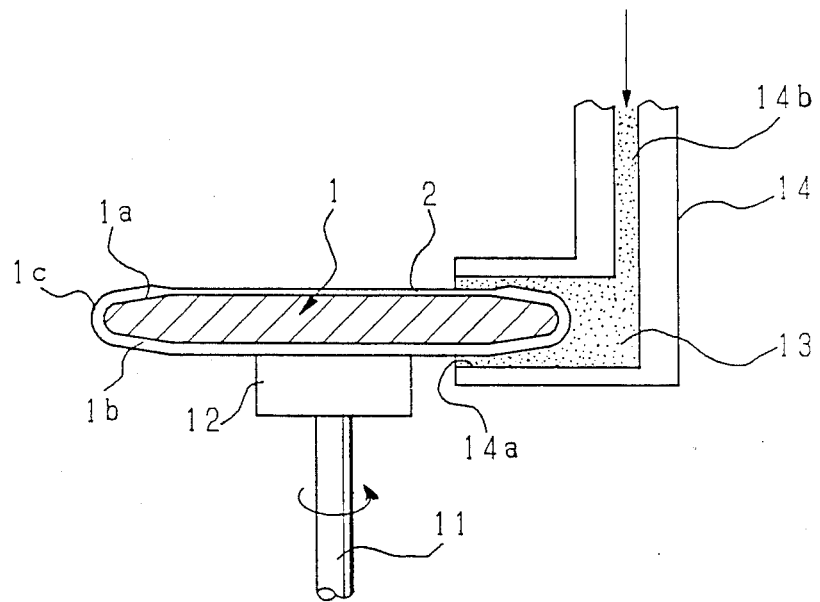
FIG. 7 is a schematic side sectional view showing a removal of a peripheral part of the blocking film by chemical etching.
Figure 8:
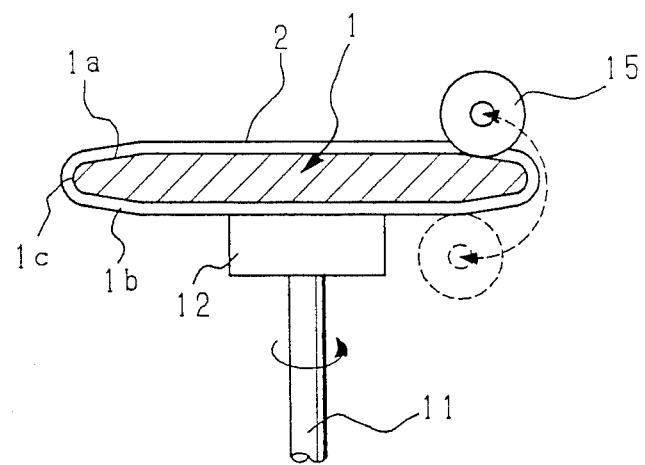
FIG. 8 is a schematic sectional side view showing a mechanical removal of a peripheral part of the blocking film.

FIGS. 7 and 8 are typical views explanatory of a method to remove the blocking film 2 from the aforesaid range. In FIG. 7, the case where the chemical etching method is applied is shown, and in FIG. 8, the case where the mechanical lapping method is applied is shown.

In FIG. 7, the substrate wafer 1 provided at the entire surface with the blocking film 2 is fixed on a chuck 12 at a rotary drive shaft 11 and rotated therearound, so that a head 14 housing therein an unwoven fabric 13, into which an etchant is permeated, is brought into press-contact with the peripheral surface of the blocking film 2, thereby removing the blocking film 2 on a region of the peripheral surface and the part of the main and rear surfaces of the substrate wafer 1. Thus, the substrate wafer 1 remaining the blocking film 2 at the main and rear surfaces except for the peripheral surface and peripheral edge portions is obtained as shown in FIG. 6-(c) or (c').

The head 14 is provided with an opening 14a into which the peripheral portion of the substrate wafer 1 is insertable at proper length and width and an etching feed conduit 14b in continuation of the opening 14a, and the unwoven fabric 13 is housed therein.

The mechanical removal method shown in FIG. 8 is that the substrate wafer 1 forming thereon the blocking film 2 is fixed to the chuck 12 at the rotary drive shaft 11 and rotated therearound like as the above mentioned method, so that a polishing grindstone 15 is moved along the peripheral portion of the tapered face 1a, the portion 1c arcuated in section, the tapered face 1b, and the edges of the main and rear surfaces at the substrate wafer, thereby removing the blocking film 2 from these portions.

After removing the blocking film 2 from the peripheral portion of the substrate wafer 1, the main surface 1d thereof covered with the blocking film 2 is subjected to a mirror processing to thereby remove the blocking film 2 from the main surface 1d and finish the main surface 1d to a mirror, thus obtaining the product of the invention as shown in FIG. 5.

In addition, in the aforesaid embodiment, explanation has been given on the mirror processing applied to the main surface 1d after removal of the blocking film from the peripheral surface of the substrate wafer 1, but the mirror processing onto the main surface 1d may be carried out prior to the removal of the same.

Figure 9:
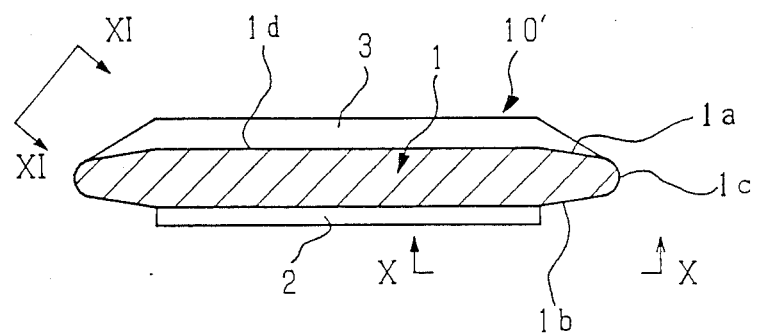
FIG. 9 is a schematic sectional view of a semiconductor wafer having an epitaxial layer.

FIG. 9 is a typical sectional view of a wafer 10' obtained by laminating an epitaxial layer on the main surface 1d of the wafer 10 shown in FIG. 5. In FIG. 9, reference numeral 3 designates an epitaxial layer and other parts are the same as those in FIG. 1 so that the corresponding parts are designated by the same reference numbers and omitted of explanation.

Figure 10:
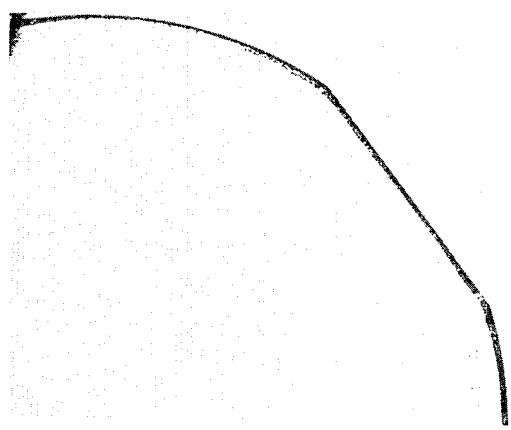
FIG. 10 is a microphotograph showing an outside appearance taken on the line X—X in FIG. 9.
Figure 11:
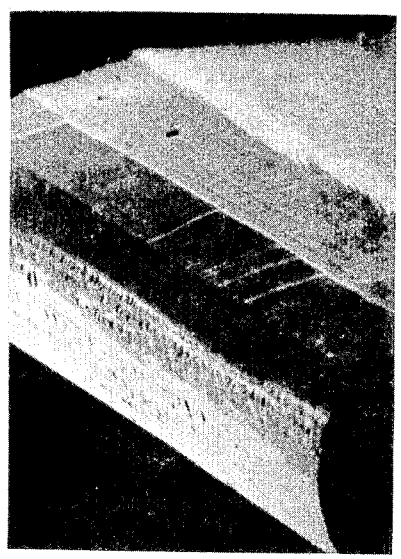
FIG. 11 is a microphotograph showing an outside appearance taken on the line XI—XI in FIG. 9.

FIG. 10 is a microphotograph showing an outside appearance of the peripheral edge of the product of the invention, taken on the line X—X in FIG. 9, and FIG. 11 is a microphotograph in section of the same taken on the line XI—XI in FIG. 9.

Figure 1A:
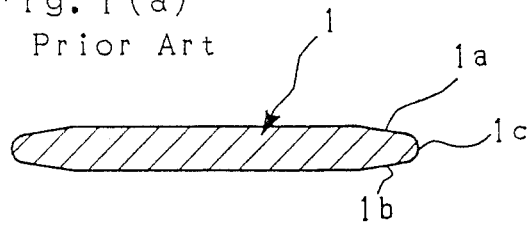
FIGS. 1(a)-(d) are a schematic sectional view showing a manufacturing process of the conventional semiconductor wafer.
Figure 1B:
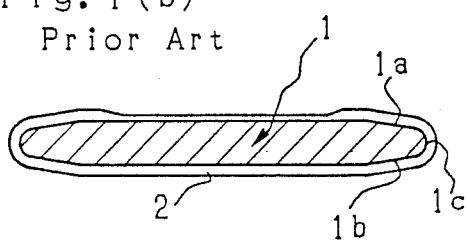
Figure 1B:
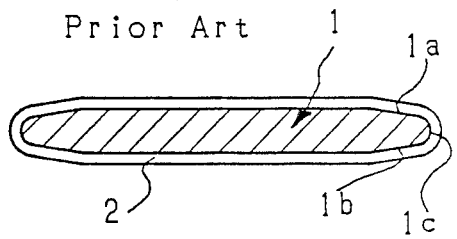
Figure 1C:
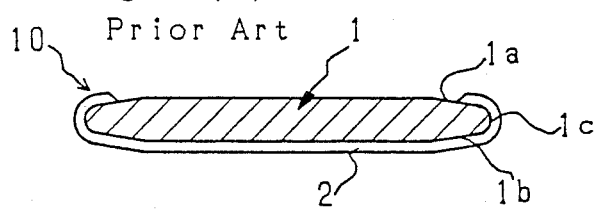
Figure 1D:
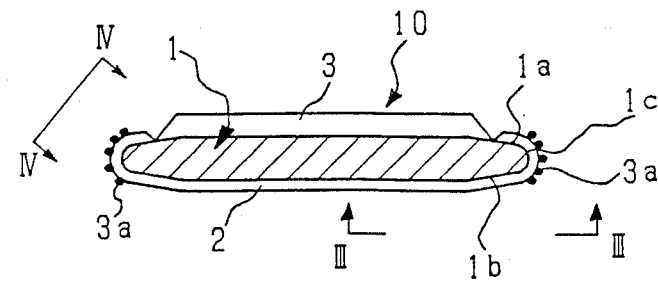
Figure 2:
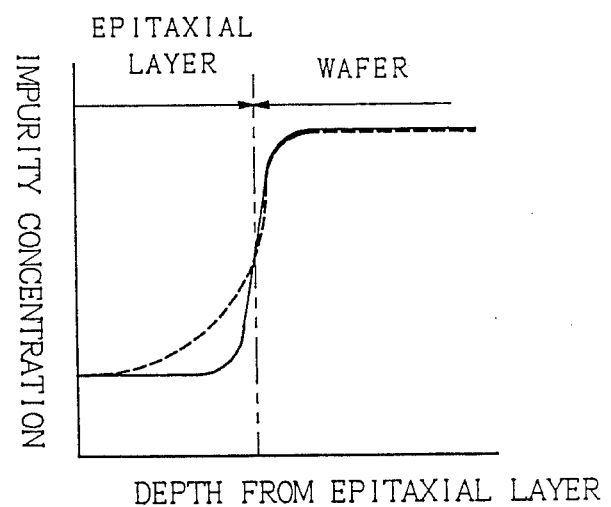
FIG. 2 is a graph showing diffusion of impurities from a substrate wafer to an epitaxial layer.
Figure 3:
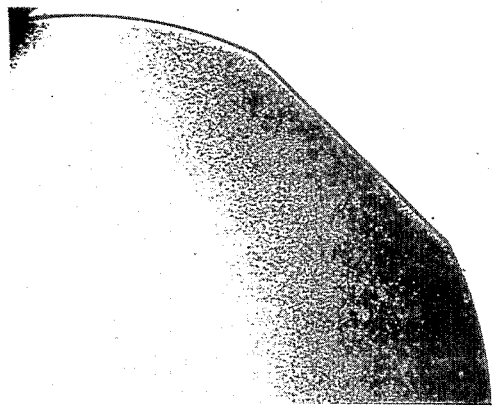
FIG. 3 is a microphotograph showing an outside appearance taken on the line III—III in FIG. 1.
Figure 4:
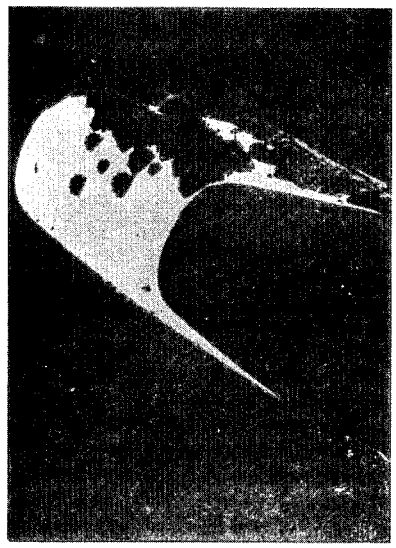
FIG. 4 is a microphotograph showing an outside appearance taken on the line IV—IV in FIG. 1.

As apparent from these photographs, in the conventional semiconductor wafer, many silicon particles 3a are formed at the peripheral surface of the wafer as shown in FIGS. 3 and 4, but the product of the present invention does not form the silicon particles at all as shown in FIG. 11.

As seen from the above, in the semiconductor wafer of the invention and by the manufacturing method therefor, the blocking film is maintained only at the rear surface of the substrate wafer, so that even when the reaction gas comes into contact with the peripheral surface of the wafer during the process of carrying out of the epitaxial growth, no silicon particles are formed thereon. Accordingly, the product and the method of the invention have the superior effect that there is not fear that the silicon particles fall from the surface of the wafer to attach to the main surface of the wafer and cause contamination during the process of manufacturing a semiconductor device.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A manufacturing method for a semiconductor wafer, comprising the steps of forming a blocking film on the entirety of one of two opposite flat surfaces of said semiconductor wafer and along a peripheral surface thereof, and removing said blocking film from said peripheral surface, characterized by the further step of producing an epitaxial layer on the surface opposite said one flat surface, at which time said blocking film prevents volatilization of impurities which would otherwise cause autodoping.

2. A manufacturing method for a semiconductor wafer as set forth in claim 1, wherein the peripheral surface of said semiconductor wafer is formed arcuated in section prior to formation of said blocking film.

3. A manufacturing method for a semiconductor wafer as set forth in claim 1, wherein said blocking film is formed by a CVD method.

4. A manufacturing method for a semiconductor wafer as set forth in claim 1, wherein said semiconductor is disc-shaped, and cloth permeated with an etchant for said blocking film is brought into contact with said blocking film while said semiconductor wafer having said blocking film formed thereon is being rotated around the center of the plane of said semiconductor wafer as the axis of rotation thereof, thereby removing said blocking film from said semiconductor wafer.

5. A manufacturing method for a semiconductor wafer as set forth in claim 4, wherein said cloth is nonwoven fabric.

6. A manufacturing method for a semiconductor wafer as set forth in claim 1, wherein said semiconductor wafer is disc-shaped and a polishing grindstone is brought into contact with said blocking film while said semiconductor wafer on which said blocking film is formed is being rotated around the center of the plane as the axis of rotation, thereby removing said blocking film from said semiconductor wafer.

* * * * *